United States Patent [19]

Foxall

[11] Patent Number: 4,777,441

[45] Date of Patent: Oct. 11, 1988

[54] ROTATING FRAME ZEUGMATOGRAPHY

[75] Inventor: David L. Foxall, San Jose, Calif.

[73] Assignee: Varian Associates, Inc., Palo Alto, Calif.

[21] Appl. No.: 29,281

[22] Filed: Mar. 23, 1987

[51] Int. Cl.⁴ .............................................. G01R 33/20
[52] U.S. Cl. ...................................... 324/314; 324/312
[58] Field of Search ............... 324/307, 308, 309, 310, 324/314, 312; 364/414

[56] References Cited

U.S. PATENT DOCUMENTS 4,689,566  8/1987  Maudsley .......................... 324/309

Primary Examiner—Stewart J. Levy
Assistant Examiner—Kevin D. O'Shea
Attorney, Agent, or Firm—Stanley Z. Cole; Edward H. Berkowitz

[57] ABSTRACT

A set of n NMR measurements are carried out in an inhomogeneous RF field. The set is parameterized by RF pulse amplitude or duration and for half the measurements the variation of RF pulse/duration is reversed and the RF phase inverted.

4 Claims, 3 Drawing Sheets

FIG.2
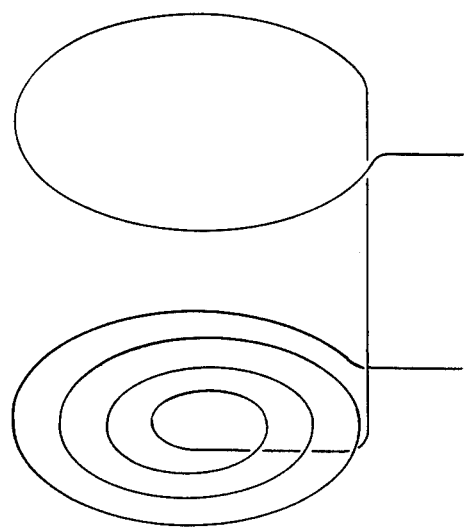
FIG.3 (PRIOR ART)
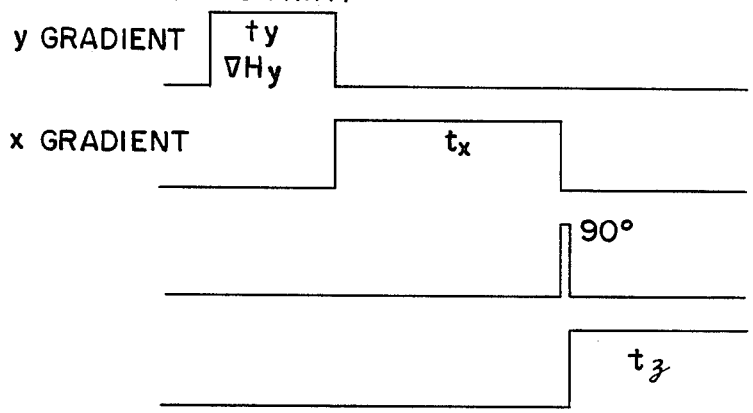
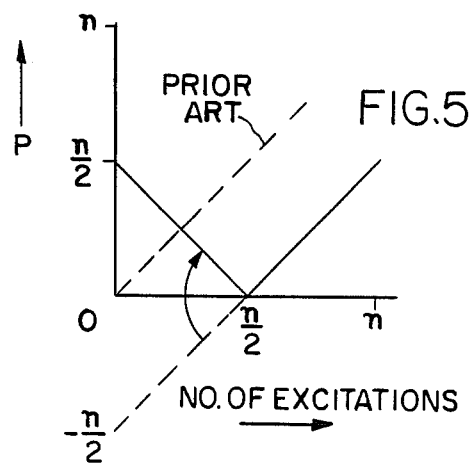
FIG.5a
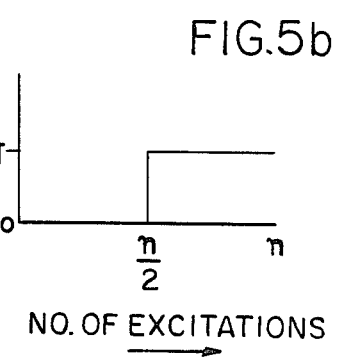
FIG.5b

ROTATING FRAME ZEUGMATOGRAPHY

FIELD OF THE INVENTION

The present invention is in the field of nuclear magnetic resonance measurements, and in particular relates to the investigation of spatial distribution of NMR phenomena in a sample.

BACKGROUND OF THE INVENTION

Spatial dependencies of nuclear magnetic resonance (NMR) phenomena on the macroscopic scale are the basis for medical diagnostic imaging, and separately measured departures from homogeneity are important for analytic purposes. The acquisition of spatial distributions of nuclear magnetic resonance properties includes methods based upon a reconstruction methodology, e.g. tomography, and also methods based upon a phase encoding principal as exposited in U.S. Pat. No. 4,070,611, commonly assigned. Both classes of NMR experiments involve rapidly switched magnetic gradients to effectuate a mapping of spatial coordinates to resonant frequency for the acquisition of some magnetic resonance parameter as a function of spatial coordinates.

A technique for magnetic resonance mapping, for which rapidly switched magnetic field gradients are not essential, is known from the work of Hoult, J. Mag. Res., Vol. 33, pp. 183–197 (1979); Cox and Styles, J. Mag. Res., Vol. 40, pp. 209–212 (1980). This approach is called rotating frame zeugmatography (RFZ). There are certain technical advantages in the RFZ approach, notably in dispensing with requirements for rapidly attaining precision magnetic field gradients and, as well, for avoiding operation of eddy currents in the object under study and the surrounds. It should be understood that static and/or switched field gradients may be used to advantage in RFZ measurements.

The operative spatial localizing principle for an experiment of the RFZ type is provided by utilizing an RF field having a selected gradient. If desired, the static polarizing field may remain homogeneous or may include magnetic field gradients depending upon the type of measurement. The RF gradient field has been produced by asymmetric saddle coils, surface coils and the like. The nutation angle of the resonating spins therefore varies over the spatial coordinates of the sample in accord with the RF field distribution. The nutation angle is a bi-linear function of both $B_1$ (the local RF magnetic field) and the pulse length of the RF irradiation; consequently, each volume element of the sample varies systematically with the pulse length, and/or pulse amplitude. A Fourier transformation in pulse length (or pulse amplitude) yields a spatial distribution in one dimension for each chemical shift value.

For off-resonant conditions, it is common to observe artifacts of three common varieties in an RFZ measurement of prior art. First, there is typically observed an asymmetry occurring in chemical shift spectra between positive and negative frequency components of the same spectral object; second, off-resonance situations give rise to a spectral contribution at zero frequency; and third, the peak position is found to shift with displacement for resonance.

In the basic experiment dealing with spatial distribution of NMR phenomena, one obtains a digitized waveform for each of a controlled number of excitations, n. A transient wave form describing the de-excitation of the resonating nuclei is observed for each such excitation. A set of such waveforms are obtained by varying some other parameter to provide a second independent variable. In the present invention that second independent variable may be either the RF power or RF pulse duration.

BRIEF DESCRIPTION OF THE PRESENT INVENTION

In a preferred embodiment of the present invention, either the RF power or RF pulse duration is incremented (or decremented) from an initial value $v_o$ over a number, n, of separate excitations such that for the $i^{th}$ such excitation, the variable $v_i$ is related to the initial variable value $v_o$ as $$\left(\frac{v_i}{v_o}\right) = (n/2) - i, \, i \leq n/2$$
$$= i - n/2, \, i > n/2$$

where n is the total number of increments and i is the index of incrementation. The phase of the RF irradiation is inverted at or after n/2 such excitations have been performed and corresponding data acquired.

DESCRIPTION OF THE DRAWINGS

FIG. 2 shows a suitable coil arrangement for obtaining the desired RF gradient field.

FIG. 3 shows a prior art pulse sequence for RFZ.

FIGS. 5a and 5b compare the invention to typical prior art.

DETAILED DESCRIPTION OF THE INVENTION

Figure 1:
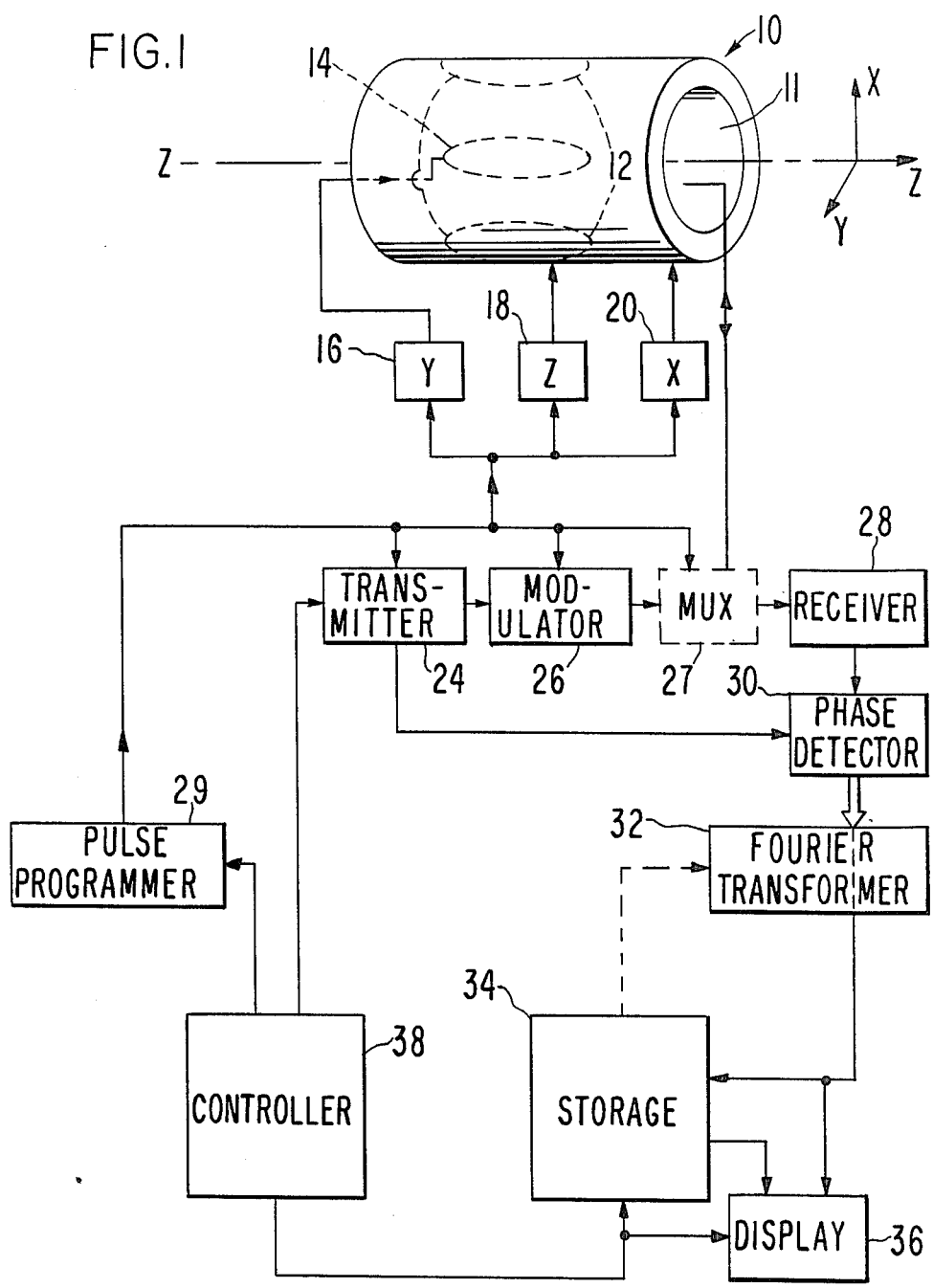
FIG. 1 describes a system for practice of the invention.

Turning now to FIG. 1, there is shown an idealized NMR apparatus. A magnet 10 having bore 11 provides a main magnetic field. In order to control the magnetic field with precision in time and direction, there are provided magnetic field gradient coils 12 and 14 schematically represented. These are driven by gradient power supplies 16, 18 and 20, respectively (all gradient coils are not shown). Additionally, gradient coils and power supplies may be required for compensating residual undesired spatial inhomogeneities in the basic magnetic field. An object for analysis (hereafter "sample") is placed within the magnetic field and the sample is subject to irradiation by RF power, such that the RF magnetic field is aligned in a desired orthogonal relationship with the magnetic field in the interior of bore 11. This is accomplished through a transmitter coil in the interior of bore 11 and not shown in FIG. 1. Resonant signals are induced in a receiver coil, proximate the sample within bore 11 and also not shown.

Turning now to FIG. 2, there is shown a representative coil arrangement for achieving a desired inhomogeneous RF distribution for the present type of measurement.

Returning now to FIG. 1, RF power is provided from transmitter 24, modulated through modulator 26 to yield amplitude modulated pulses of the RF power and thence directed to the RF transmitter coil located within bore 11. Transmitter and receiver coils are typically separate for an RFZ experiment, although this is not essential for the practice of such measurements. The inhomogeneous RF field is provided from an asymmetric transmitter coil as above described, while the receiver coil is often symmetric or may exhibit a complementary asymmetry. The identical coil may be employed for both functions if so desired and appropriate measures are taken to compensate the asymmetric sensitivity of the receiver. Thus, a multiplexer 27 is provided to isolate the receiver from the transmitter. In the case of separate transmitter and receiver coils, element 27, while not precisely a multiplexer, will perform a similar isolation function to control receiver operation.

The modulator is controlled by pulse programmer 29 to provide RF pulses of desired amplitude, duration and phase relative to the RF carrier at preselected time intervals. The pulse programmer also controls the gradient power supplies 16, 18 and 20, if such gradients are required. These gradient power supplies may maintain selected static gradients in the respective gradient coils if so desired.

The transient nuclear resonance waveform is processed by receiver 28 and further resolved in phase quadrature through phase detector 30. The phase resolved time domain signals are available for transformation to the frequency domain in accordance with specific requirements of the processing. Conversion of the analog resonance signal to digital form is commonly carried out on the phase resolved signals through ADC structures which may be regarded as a component of phase detector 30 for convenience. It is understood that the Fourier transformer may, in practice, act upon a stored representation of the phase resolved data. This reflects the common practice of averaging a number of time domain phase resolved waveforms to enhance the signal-to-noise ratio. The transformation function is then applied to the resultant averaged waveform. A display device 36 is provided to operate on the acquired data to present same for inspection. Controller 38 most often comprising one or more computor controls and correlates the operation of the entire apparatus.

The conventional RFZ experiment in three dimensions was described by Hoult and by Cox and Styles following the timing diagram of FIG. 2. Gradient pulse lengths $t_x$ and $t_y$ each result in a distribution of nutation angle as a function of the respective cartesian coordinates due to the nonhomogeneous RF field. Dispersion along the z axis is obtained, if desired, by a z gradient in the DC polarizing field. At the elapse of $t_x + t_y$ the nutation angle is given by $$v = \gamma B_{10}(t_x + t_y) + \gamma B_{11}(xt_x + yt_y)$$

where $\gamma$ is the gyromagnetic ratio, $B_{10}$ is a homogeneous irradiating field and $B_{11}$ is a linear gradient of the irradiating field. A 90° pulse is now applied in the rotating frame to flip the plane of magnetization from x' z' to x' y' where the prime refers to the rotating frame. The resulting free induction decay signal is given as $$Mo(x,y,z) =$$

$$\exp\left[i\left\{\frac{\pi}{2} + \gamma B_{10}(t_x - t_y) + \gamma B_{11}(xt_x + yt_y) - \gamma B_{01}zt_3\right\} - \frac{t_3}{T_2}\right]$$

The quantity $B_{01}$ is the z (linear) gradient of the irradiation field and $T_2$ is the spin-spin relaxation time.

For simplicity let it be assumed that the experiment is referred to a single spin type undergoing a simple relaxation delay. The spins evolve under the invluence of a nonuniform RF field during an interval $t_1$. The free induction decay is then observed over an interval $t_2$.

The Bloch equations for infinitestinal volume element of the sample describe the evolving spin system as $$\dot{M}_x = \omega M_y$$

$$\dot{M}_y = -\omega M_x + \phi \Omega M_z \qquad \text{Eq. 1}$$

$$\dot{M}_z = -\phi \Omega M_y$$

where $\omega$ is the offset frequency and $\Omega$ is the product of gyromagnetic ratio (for an assumed species of nuclei) and the RF magnetic field. The function $\phi$, introduced in the present invention, has the magnitude $|1|$ and is positive or negative in direct relation with the signs of the rotating coordinates. For the prior art $\phi$ is invariant for all $t_1$. The solution of equation 1 can be written $$M_y(t_1) = \phi\alpha \sin \psi |t_1| \qquad \text{Eq. 2(a)}$$

$$M_x(t_1) = \phi\beta(1 - \cos \psi |t_1|) \qquad \text{Eq. 2(b)}$$

where $$\psi^2 = \omega^2 + \Omega^2$$

$$\alpha = \frac{\Omega M_o}{\psi}$$

$$\beta = \frac{\omega \Omega M_o}{\psi^2}$$

During the acquisition interval the RF irradiation is turned off and the transverse magnetization which has evolved in the interval $t_1$ now precesses about the z axis of the rotating frame. The Bloch equations, now obtaining are for which one may describe solutions in the form $$M(t_1, t_2) = [M_y(t_1) + iM_x(t_1)] e^{i\omega t_2 - \frac{t_2}{T_2}}$$

where $t_1$ and $t_2$ refer to the evolution and acquisition portions of the experiment.

The conventional RFZ experiment collects time domain waveforms over $t_2$ for values of $t_1$ incremented through positive values of $t_1$ (the second Fourier variable) to some maximum value. In the present discussion $t_1$ measures either the interval or the amplitude of the RF pulse. Transformation with respect to $t_2$ yields a resonance line in one dimension ($\omega_2$) modulated by a function of $t_1$. In the most straightforward example, the Fourier transform of that modulation yields $$F(\omega_1) = \beta[iA(\omega_1) + D(\omega_1)] -$$

$$\frac{\alpha + \beta}{2} [iA(\omega_1 - \psi) + D(\omega_1 - \psi)] +$$

$$\frac{\alpha - \beta}{2} [iA(\omega_1 + \psi) + D(\omega_1 + \psi)]$$

These results are to be expected from the prior art.

Thus, the RFZ model experiment yields 3 spectral peaks having the intensities $\beta$ at $\omega_1$, $(\alpha+\beta/2)$ at $(\omega_1-\psi)$ and $(\alpha-\beta/2)$ at $(\omega_1+\psi)$.

In prior art studies the values of $t_1$ are limited to positive values and analysis is directed to the condition of exact resonance where there is vanishing intensity of the central peak at $\omega_1$ and the two peaks at $\omega_1 \pm \psi$ are symmetric.

In the present invention, the Bloch equations (eqs. 1) are modified by redefining the function such that $$\phi = +1 \chi > 0$$
$$\phi = -1 \chi < 0$$

leading to a Fourier transform (for the second variable $t_1$ amplitude) of the free induction decay $$F(\omega_1) = 2D(\omega_1) -$$
$$[i\alpha A(\omega_1 - \psi) + \beta D(\omega_1 - \psi)] +$$
$$[i\alpha A(\omega_1 + \psi) - \beta D(\omega_1 + \psi)]$$

The variable $\psi$ is an identifier labeling the value of the variable $t_1$ and describing the RF phase prevailing for tht excitation. The phase inversion for one half of the values of the second Fourier variable $t_1$, or corresponding RF amplitude, provides a data set over the range of such second variable having the effect of rendering such range symmetric about the origin of the second variable $t_1$.

This result also yields three lines in the frequency domain corresponding to the $t_1$ variable. Here however, the lines at $\pm \psi$ are of equal intensity for both on- and off-resonance cases and the amplitude is found to be twice the amplitude of the conventional experiment.

The off-resonance behavior is summarized in equs. 2(a) and 2(b). The artifacts may be identified with the behavior of terms having the form of equ. 2(b). In the present invention the factor $\phi$ is an odd function of the second Fourier variable and operates on the magnetization component to yield an odd function in contrast to the prior art where an even function is produced. It is this difference in symmetry which yields the advantages of the present invention: upon transformation from the domain of the second Fourier variable, the odd symmetry terms tend to cancel.

Figure 4:
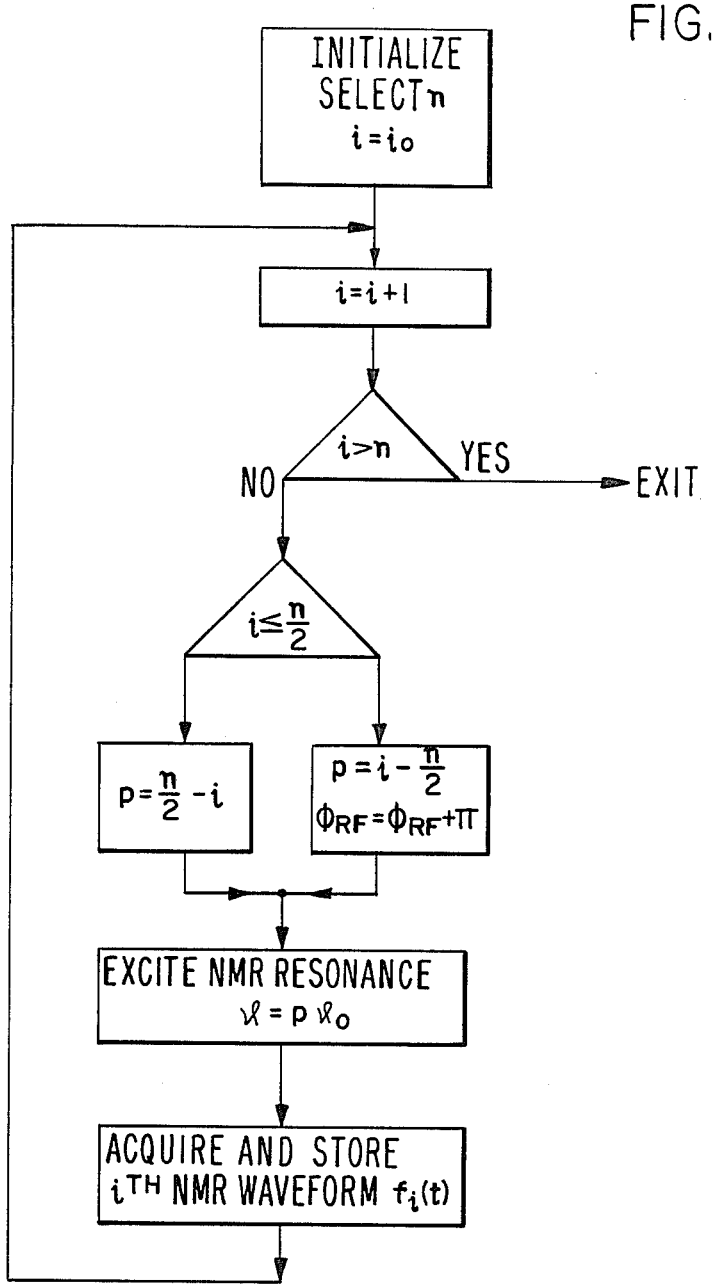
FIG. 4 is a flow chart illustrating practice of the invention.

FIG. 4 is a schematic illustration of the operation of the invention in executing n experiments to form a data set according to the present invention. A loop counter is incremented and tested to establish that the next NMR excitation is not beyond the set. The set value of $t_1$ values are labeled by the loop counter to take on successive values of pulse length - - - $\tau_{i-1}$, $\tau_i$ - - - each a multiple of a selected value $\tau_0$ for pulse width variation. For variation of pulse amplitude, the successive RF pulses of the set exhibit amplitude values - - - $A_{i-1}$, $A_i$ - - - where these amplitudes are multiples of a selected unit amplitude $A_0$. The index is then tested to determine whether the next, e.g. $i^{th}$ excitation is beyond the midpoint of the data set and thus beyond the median value of the second variable. If the index is beyond the midpoint of the set, that is, n/2, the next excitation to be performed will be a member of a subset for which the variation of the second independent variable (the RF power or RF pulse duration) is to be reversed according to the invention. That is, the multiplier p is inverted in sign and the phase of the RF pulse is shifted by 180° for the remaining n/2 measurements. Thus the actual subset of multipliers p in the interval $0 \leq p < (n/2)$ may be identified with a set of $t_1$ values corresponding to the dotted, lower limb of negative multipliers shown in FIG. 5A. Under these conditions, the value of the second Fourier variable is determined and the next excitation is performed using that value. In effect the nutation angle for nuclear spins at any point in the sample will be altered (over the value prevailing at the previous resonance excitation) by the combined effect of the now prevailing value of p and the phase of the RF pulse. This is illustrated at FIGS. 5A and 5B which defines the locus of multipliers p for the invention in comparison with prior art.

As a practical matter, the choice of n, the number of values of the "second" Fourier variable whether an interval or amplitude (commonly referred to as $t_1$), is ordinarily taken as a power of 2 and hence is an even integer. The value of $\eta$ need not be selected as either a power of 2 nor need n be chosen to be even as a necessary condition(s) for the practice of the invention. The choice of n, odd, is understood as inclusion of certain data at the midpoint in the range of the second Fourier variable. Where n is even, the range of the second Fourier variable includes a null value for which no data need be actually acquired but for which a null waveform is included in the data set. That is, a null waveform enters the data set by interpolation or, if desired, by processing a null signal (noise). For the case of n even, actual waveforms $f_k$ and $f_{k+1}$ are obtained for values of the second Fourier variable symmetrically disposed about the median value of the second variable. Thus, at the origin, the second Fourier variable ($t_1$ or an RF amplitude) has vanishing magnitude. The change of phase of the RF pulse is determined by whether the next member of the data set (value of $t_1$ or amplitude) is a member of the subset on one side or the other of the origin of the second Fourier variable. For n odd, the origin of the second Fourier parameter corresponds to a null value also because the RF pulse duration, or its amplitude has the value 0 at the origin. Consequently, no RF pulse is defined at that point and FIGS. 5a and 5b make no distinction between n even or n odd. A distinction for n even or odd (if any) is only to be found in the distribution of discrete points on the function p(n).

What is claimed is:

1. The method of acquiring a differential spatial distribution of NMR chemical shift comprising the steps of
    (1) selecting a number, n, of NMR excitation to form a data set,
    (2) exciting the $i^{th}$ one of said NMR excitations in a sample by an RF pulse of selected amplitude and length $\tau_{i-1}$, i an integer and $1 \leq i \leq n$ and $\tau_{i-1}$ a multiple of a selected time interval $\tau_0$,
    (3) carrying out i+1 excitations while for successive excitations changing the value of
    $\tau_{i-1}$ to a value $$\tau_i = ((n/2)-i)\tau_0 \text{ for } i \leq (n/2)$$

or changing the value of
    $\tau_{i-1}$ to a value $$\tau_i = (i-(n/2))\tau_0 \text{ for } i > n,$$

(4) changing the phase of said RF pulse by 180° upon the occurrence of i>n/2 and for successive values of i>n/2, (5) acquiring and storing the resonant data consequent to each said n excitations.

2. The method of claim 1 wherein said selected amplitude is maintained at a constant value for the n excitations.

3. The method of acquiring a differential spatial distribution of NMR chemical shift comprising the steps of
   (1) selecting a number, n, of NMR excitations to form a data set,
   (2) exciting the $i^{th}$ one of said NMR excitations in a sample by an RF pulse of selected length and amplitude $A_{i-1}$, i an integer and $1 \leq i \leq n$ and $A_{i-1}$ a multiple of a selected unit amplitude $A_0$,
   (3) carrying out i+1 excitations while for successive excitations changing the value of $A_{i-1}$ to a value
   $$A_i = ((n/2) - i)A_0 \text{ for } i \leq (n/2)$$
   or changing the value of $A_{i-1}$ to a value
   $$A_i = (i - (n/2))A_0 \text{ for } i > (n/2),$$
   (4) changing the phase of said RF pulse by 180° upon the occurrence of i>(n/2) and for successive values of i>n/2,
   (5) acquiring and storing the resonant data consequent to each said n excitations.

4. The method of claim 3 wherein said length is maintained at a constant value for the n excitations.

* * * * *

UNITED STATES PATENT AND TRADEMARK OFFICE
CERTIFICATE OF CORRECTION

PATENT NO. : 4,777,441
DATED : October 11, 1988
INVENTOR(S) : David L. Foxall

It is certified that error appears in the above-identified patent and that said Letters Patent is hereby corrected as shown below:

Claim 1, col. 6, line 64: Delete "n" and insert --n/2--.

Signed and Sealed this

First Day of December, 1992

Attest:

DOUGLAS B. COMER

*Attesting Officer*  *Acting Commissioner of Patents and Trademarks*